(12) United States Patent
Sung et al.

(10) Patent No.: US 10,998,270 B2
(45) Date of Patent: May 4, 2021

(54) LOCAL INTERCONNECT FOR GROUP IV SOURCE/DRAIN REGIONS

(71) Applicant: INTEL CORPORATION, Santa Clara, CA (US)

(72) Inventors: Seung Hoon Sung, Portland, OR (US); Glenn A. Glass, Portland, OR (US); Van H. Le, Portland, OR (US); Ashish Agrawal, Hillsboro, OR (US); Benjamin Chu-Kung, Portland, OR (US); Anand S. Murthy, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/337,794

(22) PCT Filed: Oct. 28, 2016

(86) PCT No.: PCT/US2016/059295
§ 371 (c)(1),
(2) Date: Mar. 28, 2019

(87) PCT Pub. No.: WO2018/080513
PCT Pub. Date: May 3, 2018

(65) Prior Publication Data
US 2020/0006229 A1    Jan. 2, 2020

(51) Int. Cl.
*H01L 23/535*     (2006.01)
*H01L 29/78*      (2006.01)
(Continued)

(52) U.S. Cl.
CPC ........ *H01L 23/535* (2013.01); *H01L 27/0924* (2013.01); *H01L 29/41783* (2013.01);
(Continued)

(58) Field of Classification Search
CPC .............. H01L 23/535; H01L 27/0924; H01L 29/41783; H01L 29/42392; H01L 29/785;
(Continued)

(56) References Cited

U.S. PATENT DOCUMENTS

| 5,439,839 A | 8/1995 | Jang |
| 7,755,104 B2 | 7/2010 | Yagishita |

(Continued)

FOREIGN PATENT DOCUMENTS

| WO | WO-2015142357 A1 * | 9/2015 | ........... H01L 29/167 |
| WO | 2018080513 A1 | 5/2018 | |

OTHER PUBLICATIONS

International Search Report and Written Opinion received for PCT/US2016/059295. dated Jul. 20, 2017. 7 pages.
(Continued)

*Primary Examiner* — Christine A Enad
(74) *Attorney, Agent, or Firm* — Schwabe, Williamson & Wyatt, P.C.

(57) ABSTRACT

Techniques are disclosed for forming transistor devices having reduced interfacial resistance in a local interconnect. The local interconnect can be a material having similar composition to that of the source/drain material. That composition can be a metal alloy of a group IV element such as nickel germanide. The local interconnect of the semiconductor integrated circuit can function in the absence of barrier and liner layers. The devices can be used on MOS transistors including PMOS transistors.

20 Claims, 10 Drawing Sheets

(51) Int. Cl.
*H01L 29/417* (2006.01)
*H01L 29/423* (2006.01)
*H01L 27/092* (2006.01)
*H01L 21/768* (2006.01)
*H01L 21/8238* (2006.01)

(52) U.S. Cl.
CPC ...... *H01L 29/42392* (2013.01); *H01L 29/785* (2013.01); *H01L 21/76895* (2013.01); *H01L 21/823821* (2013.01); *H01L 21/823871* (2013.01)

(58) Field of Classification Search
CPC ....... H01L 21/76895; H01L 21/823821; H01L 21/823871
See application file for complete search history.

(56) References Cited

U.S. PATENT DOCUMENTS

| | | | |
|---|---|---|---|
| 7,790,631 B2 | 9/2010 | Sharma et al. | |
| 8,088,665 B2 | 1/2012 | Rachmady et al. | |
| 8,809,836 B2 | 8/2014 | Pillarisetty et al. | |
| 9,024,418 B2 | 5/2015 | Zhu et al. | |
| 9,385,197 B2 | 7/2016 | Kelly et al. | |
| 9,859,424 B2* | 1/2018 | Glass | H01L 21/76224 |
| 2004/0262683 A1 | 12/2004 | Bohr et al. | |
| 2009/0315182 A1* | 12/2009 | Besser | H01L 21/76883 257/754 |
| 2009/0321851 A1 | 12/2009 | Awano | |
| 2010/0163847 A1* | 7/2010 | Majhi | H01L 29/7848 257/24 |
| 2011/0049454 A1* | 3/2011 | Terao | H01L 45/12 257/2 |
| 2012/0156857 A1 | 6/2012 | Cohen et al. | |
| 2013/0248999 A1* | 9/2013 | Glass | H01L 29/36 257/335 |
| 2014/0374844 A1 | 12/2014 | Lavoie et al. | |
| 2015/0228789 A1 | 8/2015 | Basker et al. | |
| 2016/0064287 A1 | 3/2016 | Liu et al. | |
| 2016/0254370 A1 | 9/2016 | Kelly et al. | |
| 2016/0293702 A1 | 10/2016 | Chen et al. | |
| 2017/0012124 A1* | 1/2017 | Glass | H01L 29/161 |
| 2017/0040449 A1* | 2/2017 | Asenov | H01L 29/41775 |

OTHER PUBLICATIONS

International Preliminary Report on Patentability received for PCT/US2016/059295. dated Apr. 30, 2019. 9 pages.

Algahtani, et al., "Low Temperature of Formation of Nickel Germanide on Crystalline Germanium," IEEE, Proc. 29th International Conference on Microelectronics (MIEL 2014), May 12-15, 2014. 4 pages.

Shifren, et al., Predictive Simulation and Benchmarking of Si and Ge pMOS FinFETs for Future CMOS Technology, IEEE Transactions on Electron Devices, vol. 61, No. 7., Jul. 2014. pp. 2271-2277.

Author unknown, Chapter 6, CMOS Design, downloaded from Internet at URL: http://www.soc.napier.ac.uk/~bill/pdf/ICD_C06.PDF on Sep. 24 2016, pp. 77-82.

A. P. Paplinski, IC Design, Chapter 2, MOS Transistors, Jul. 25, 2002, 22 pages.

Office Action and Search Report from Taiwan Patent Application No. 106130176, dated Jan. 14, 2021, 8 pgs., no translation.

* cited by examiner

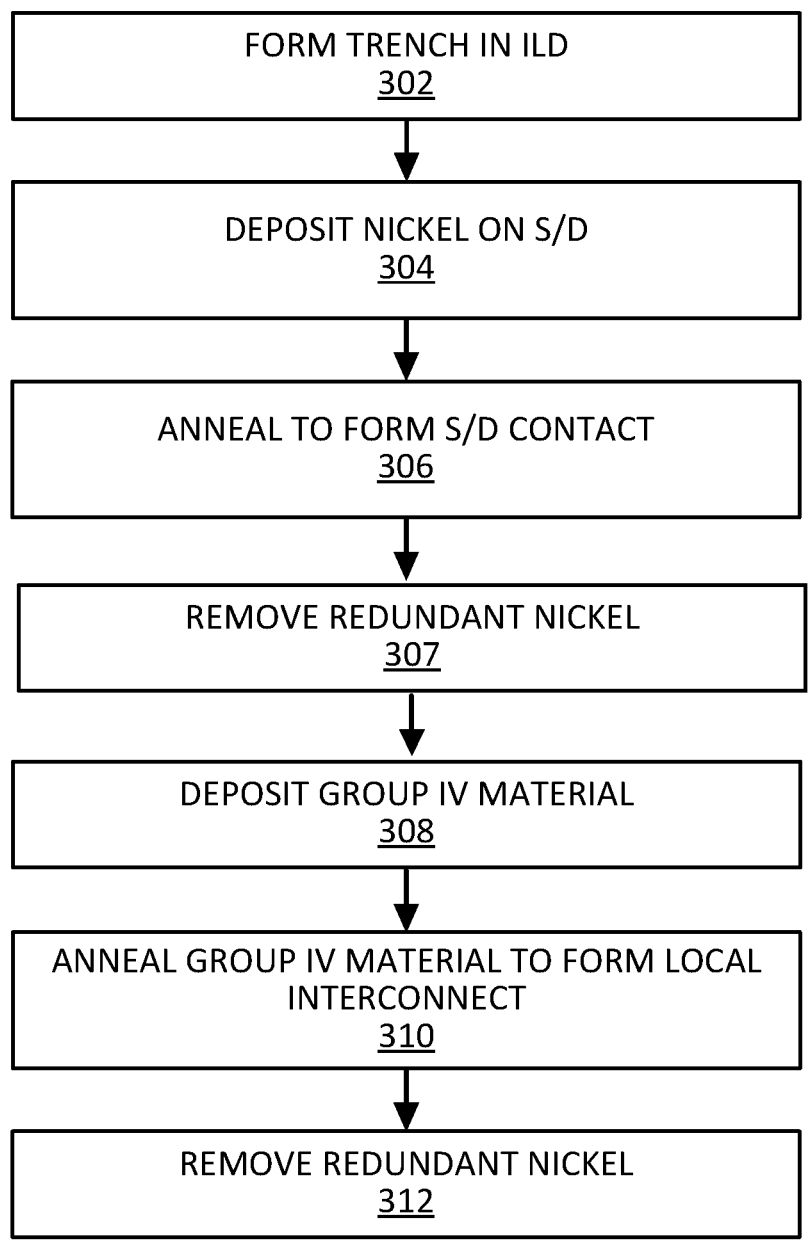

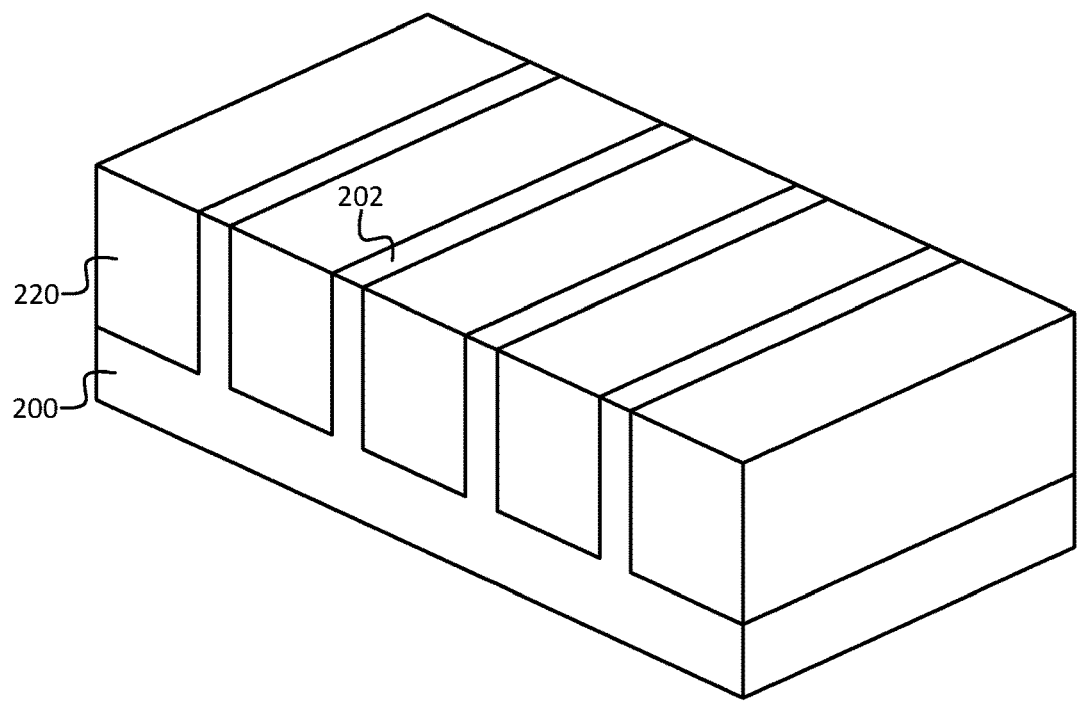
FIG. 2C
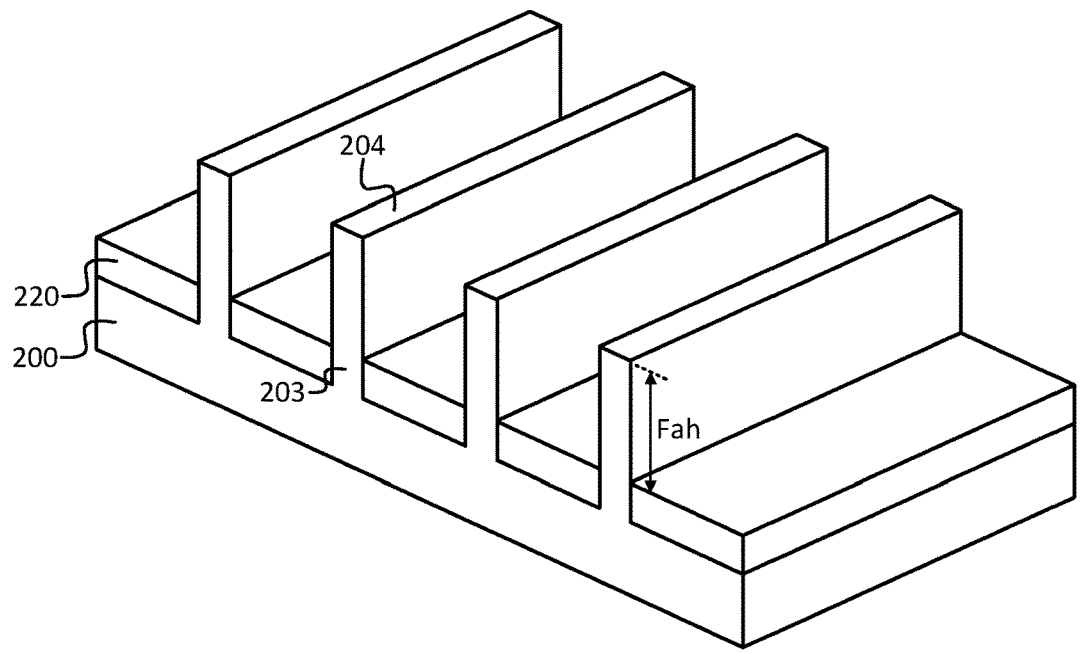
FIG. 2D
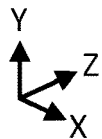

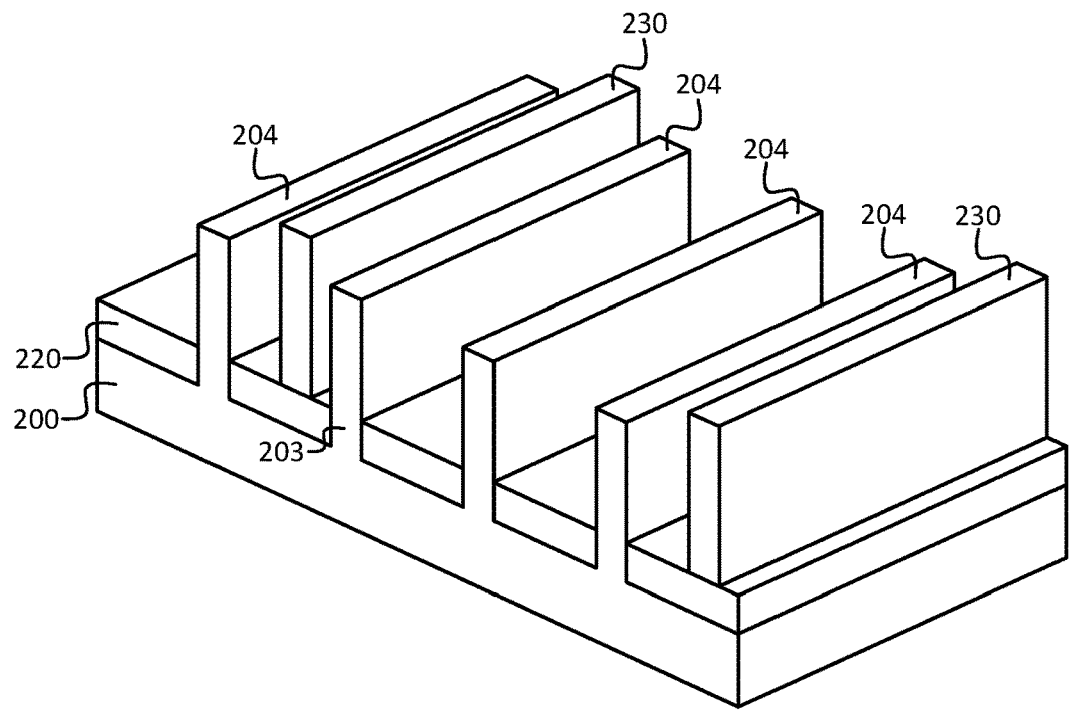
FIG. 2E
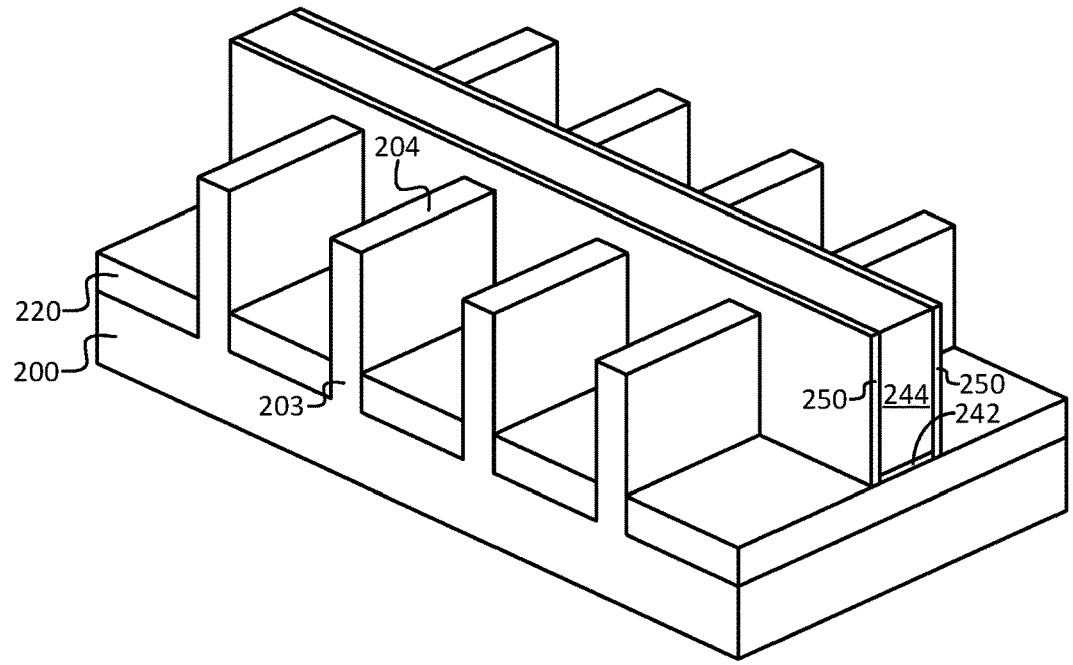
FIG. 2F
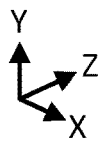

LOCAL INTERCONNECT FOR GROUP IV SOURCE/DRAIN REGIONS

CROSS-REFERENCE TO RELATED APPLICATIONS

This patent application is a U.S. National Phase Application under 35 U.S.C. § 371 of International Application No. PCT/US2016/059295, filed on Oct. 28, 2016, entitled "LOCAL INTERCONNECT FOR GROUP IV SOURCE/ DRAIN REGIONS" the entire contents of which is hereby incorporated by reference herein.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices it is often desired to minimize the parasitic resistance associated with source/drain contacts otherwise known as external resistance (Rext).

BRIEF DESCRIPTION OF THE DRAWINGS

FIG. 1B is a method for forming a low resistance local interconnect, in accordance with an embodiment of the present disclosure.

FIGS. 2A to 2H provide perspective views of structures that are formed when carrying out the method of FIG. 1A, in accordance with an embodiment of the present disclosure.

Figure 1A:
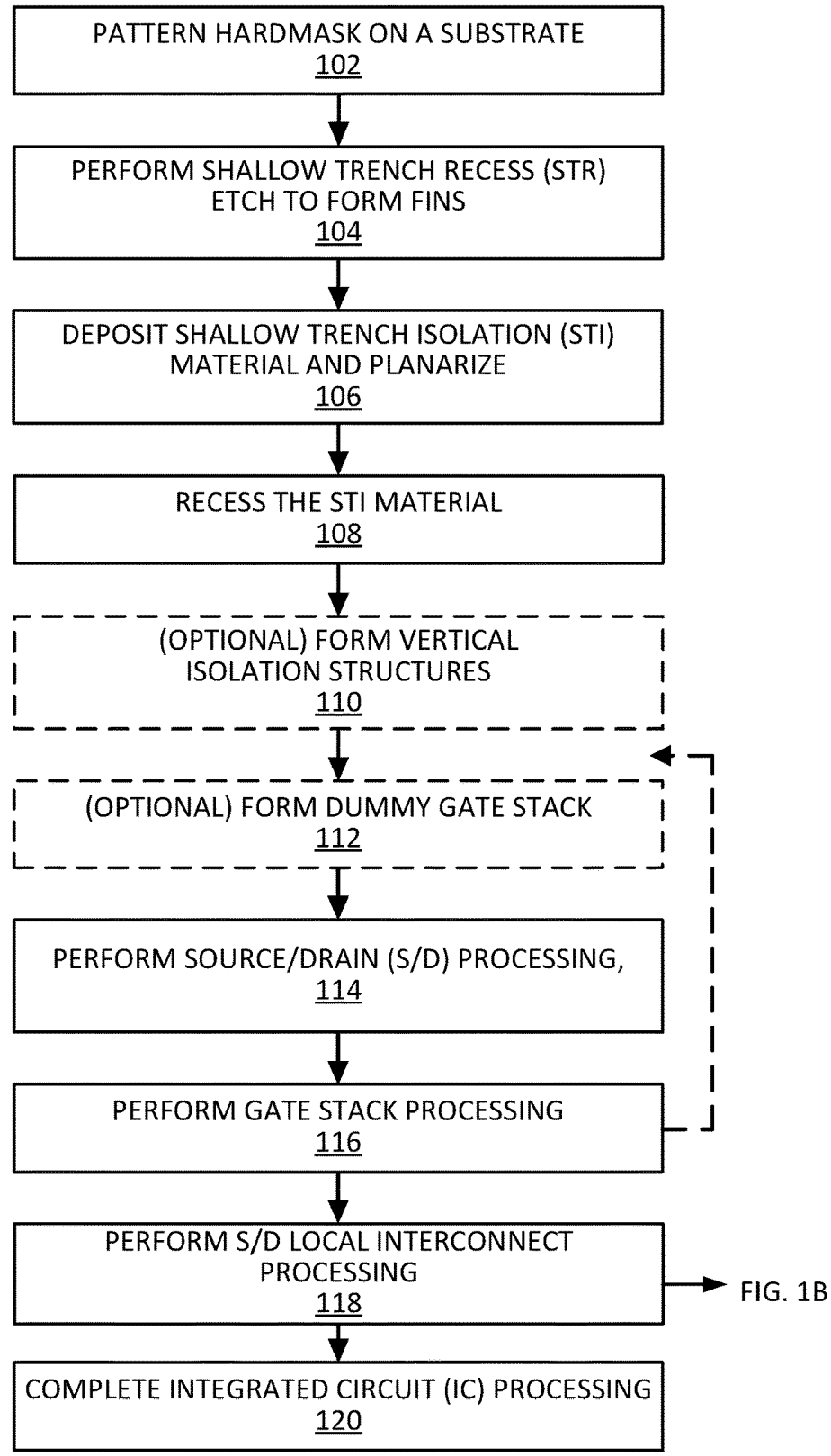
FIG. 1A is a method for forming a transistor structure with a low resistance local interconnect, in accordance with an embodiment of the present disclosure.

As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming transistor devices having self-aligned contacts for local interconnects that can reduce interfacial resistance between a source/drain (s/d) and the local interconnect when compared to conventional devices. The techniques described herein can also provide for a larger volume local interconnect (LI) in the same space because a barrier, liner or both can be eliminated. The techniques can be implemented, for instance, at the point in the semiconductor process flow where traditional local interconnect processing would employ a standard contact stack such as one or more metals (e.g., W, Co or Ru) on silicon (Si) or silicon germanium (SiGe) or germanium (Ge) source/ drain regions. In some embodiments, the techniques can be used to implement the local interconnects of MOS transistors (e.g., PMOS or NMOS devices), where the contact resistance between the source/drain regions and the local interconnect is reduced without necessarily increasing the contact area or the volume of the contact or local interconnect. The local interconnect can be deposited in narrow and sloped trenches that typically interfere with top-down metal deposition at sub 25 and sub 14 nm dimensions. The techniques can be used on numerous transistor architectures (e.g., planar, finned, and nanowire transistors), including strained and unstrained channel structures. In various PMOS and NMOS embodiments, the local interconnect can provide a homogeneous path from a source/drain region to the backend interconnect structure (e.g., metal layers M1 through M9) of a semiconductor device.

General Overview

As previously explained, contact resistance is one component of a semiconductor device's overall resistance. A typical transistor contact stack includes, for example, a silicon, germanium or SiGe source/drain layer, a silicide/ germanide layer, a titanium nitride adhesion layer (sometimes called a liner), and a tungsten or cobalt contact/local interconnect. Silicides and germanides of metals such as tungsten and cobalt can be formed on the source-drain regions prior to local interconnect formation. In such configurations, the contact resistance is relatively high and effectively limited by the germanium valence band alignment to the pinning level in the metal (e.g., tungsten). Some possible approaches to forming contacts may employ alloys with bandgaps in the range 0.5-1.5 eV, or higher. While some such contact forming approaches may be appropriate for n-type transistor structures, they are not appropriate for p-type transistor structures.

Thus, and in accordance with an embodiment of the present disclosure, a metal and Group IV material alloy is formed in a trench to provide a local interconnect that exhibits low interfacial resistance with the source/drain or with a contact on the source/drain. The metal can be, for example, any metal that can form an alloy with the Group IV material. In specific embodiments, the metal can be one or more of nickel, cobalt and tungsten. For clarity, nickel is used throughout this disclosure as an example embodiment. No liner or barrier layer is needed in the local interconnect, so the volume of alloy can be relatively large compared to, for example, a tungsten or cobalt interconnect that includes a liner and/or barrier. The same alloy material can be deposited over both p-type and n-type source/drain regions, to provide a single continuous mass that includes the local interconnect. Note that the source/drain material can be doped or undoped, and in various embodiments can include two, three or more distinct sections that may be doped differently. For example, in some embodiments, a portion of the source/drain may be intrinsic (e.g., no dopant or dopant at less than 1E16 atoms/cm$^3$) while another may be very highly doped (e.g., greater than 1E18 atoms/cm$^3$). The transistor structure may include p-type source/drain regions, n-type source/drain regions, or both n-type and p-type source/drain regions. In some example embodiments, the transistor structure includes dopant-implanted source/drain regions or epitaxial (or polycrystalline) replacement source/ drain regions of silicon, SiGe alloys, or nominally pure germanium films (e.g., such as those with less than 10% silicon) in a MOS structure. In any such implementations, a layer or cap of a nickel alloy can be formed directly over the source/drain regions, in accordance with an embodiment of the present disclosure.

In some embodiments, the local interconnect (LI) can be of homogeneous composition with the source/drain material or with the source/drain contact or with both. In certain embodiments the local interconnect may include Ni along with materials such as, for example, silicon, germanium and SiGe. The local interconnect may also include impurities such as nickel migration suppression agents. Migration suppression agents can include, for example, any combination of platinum (Pt), palladium (Pd) and darmstadtium (Ds). These materials may be present in the LI, individually or collectively, in concentrations of from 0.01 to 20%, 0.01 to 10%, 0.01 to 5% or 1 to 5%, by weight. Inclusion of these metal impurities can aid in suppression of nickel migration into the channel which, absent these impurities, can, in some cases, cause a source/drain short. This shorting issue surrounding the use of nickel is also referred to as the "nickel pipe" phenomenon.

Upon analysis (e.g., SEM or XTEM with EDX), a structure configured in accordance with an example embodiment of the present disclosure composition will effectively show, in some cases, an essentially homogeneous portion including a metal/Group IV contact on the source/drain and the metal/Group IV local interconnect passing through the interlayer dielectric. In particular embodiments, a continuous metal/Group IV interconnect will be evident from the source/drain material through the interlayer dielectric. In still further embodiments, a continuous metal/Group IV body is provided that includes at least a portion or all of the source/drain region and the local interconnect. This will be in contrast, for example, to the readily detectable interface between a nickel germanide contact and a standard metal local interconnect. As will be appreciated, any number of semiconductor devices or circuitry having a need for high performance contacts can benefit from the low resistance local interconnect techniques provided herein.

Thus, transistor structures configured in accordance with embodiments of the present disclosure provide an improvement over conventional structures with respect to lower contact resistance. Numerous process variations will be apparent in light of this disclosure. For instance, the source/drain contact can be deposited on the source-drain regions before an insulator layer is deposited above the source/drain layer. Alternatively, the source-drain contacts can be deposited after an insulator layer is deposited above the source/drain layer regions and contact trenches have been etched to the source/drain layer. In some embodiments, the local interconnect can be formed after the deposition of the insulator layer.

Architecture and Methodology

FIG. 1A illustrates a method 100 of forming an integrated circuit including one or more transistors including source/drain (S/D) devices connected to self-aligned low resistance local interconnects (LI), in accordance with one or more embodiments of the present disclosure. FIGS. 2A-F illustrate example integrated circuit structures that are formed when carrying out method 100 of FIG. 1A, in accordance with various embodiments. In various embodiments, method 100 can include gate first or gate last process method flows. The structures of FIGS. 2A-F are primarily depicted and described herein in the context of forming finned transistor configurations (e.g., FinFET or tri-gate), for ease of illustration. However, the techniques can be used to form transistors of any suitable geometry or configuration, depending on the end use or target application. For example, other embodiments may employ configurations including nanowire and planar transistor devices. Various example transistors that can benefit from the techniques described herein include, but are not limited to, field-effect transistors (FETs), metal-oxide-semiconductor FETs (MOSFETs), tunnel-FETs (TFETs), planar configuration transistors, finned configuration transistors (e.g., FinFET, tri-gate), and nanowire (or nanoribbon or gate-all-around) configuration transistors. In addition, the techniques can be used to benefit p-type devices (e.g., p-MOS and p-TFET) and/or n-type devices (e.g., n-MOS and n-TFET). Further, the techniques may be used to form complementary MOS (CMOS) and/or complementary TFET (CTFET) transistors/devices/circuits, where either or both of the included p-type and n-type transistors may include single or double-charge dopants in the S/D regions as variously described herein. Other example transistor devices include few to single electron quantum transistor devices, for example. Further still, such devices may employ semiconductor materials that are three dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond). In a more general sense, the local interconnect structures provided herein can be used with any number of transistor configurations, and the present disclosure is not intended to be limited to any particular such configurations.

Figure 2A:
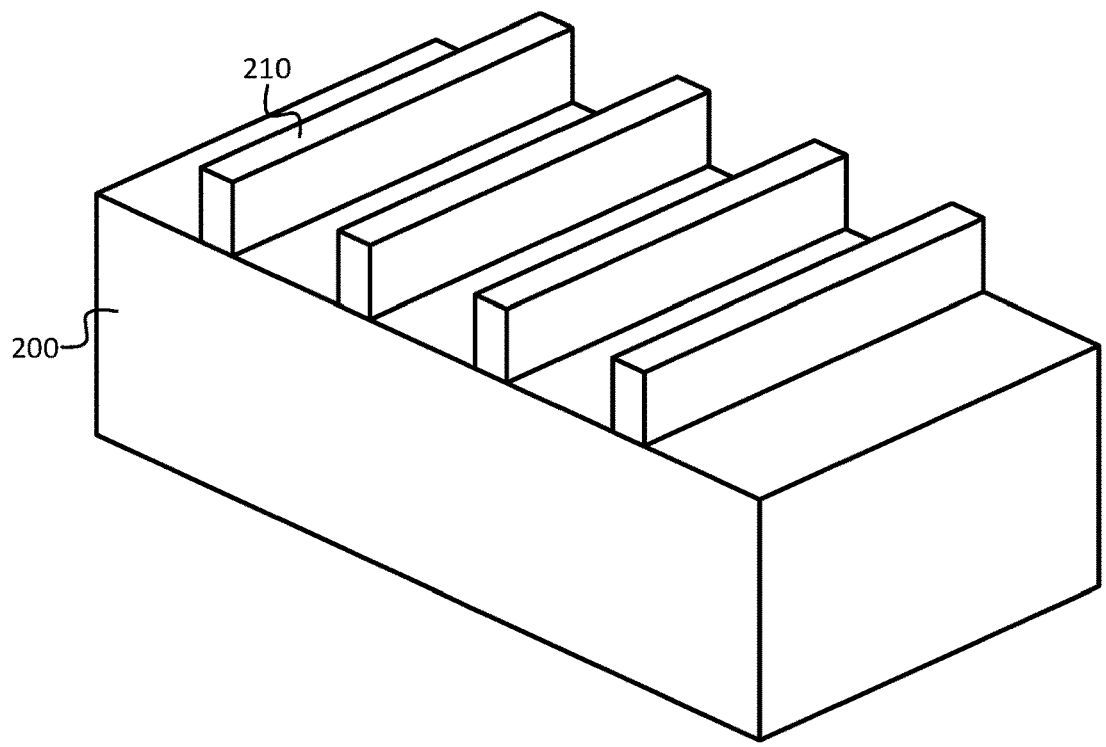

Method 100 of FIG. 1A includes patterning 102 hardmask 210 on a substrate 200 to form the example resulting structure shown in FIG. 2A, in accordance with an embodiment. Hardmask 210 may be formed or deposited on substrate 200 using any suitable technique, as will be apparent in light of this disclosure. For example, hardmask 210 may be blanket deposited or otherwise grown on substrate 200 using chemical vapor deposition (CVD), atomic layer deposition (ALD), physical vapor deposition (PVD), spin-on processing, and/or any other suitable process to form hardmask 210 on substrate 200. In some instances, the top surface of substrate 200 on which hardmask 210 is to be deposited may be treated (e.g., chemical treatment, thermal treatment, etc.) prior to deposition of the hardmask 210 material. Hardmask 210 can be patterned 102 using any suitable techniques, such as one or more lithography and etch processes, for example. Hardmask 210 may include of any suitable material, such as various oxide or nitride materials, for example. Specific oxide and nitride materials may include silicon oxide, titanium oxide, hafnium oxide, aluminum oxide, silicon nitride, or titanium nitride, just to name a few. In some cases, the hardmask 210 material may be selected based on the material of substrate 200.

Substrate 200, in some embodiments, may include: a bulk substrate including group IV (the carbon group) semiconductor material, such as silicon (Si), germanium (Ge), silicon germanium (SiGe), or silicon carbide (SiC), and/or at least one group III-V material and/or any other suitable material(s) as will be apparent in light of this disclosure; an X on insulator (XOI) structure where X is one of the aforementioned materials (e.g., group IV and/or group III-V) and the insulator material is an oxide material or dielectric material or some other electrically insulating material; or some other suitable multilayer structure where the top layer includes one of the aforementioned materials (e.g., group IV and/or group III-V). Note that group IV semiconductor material (or group IV material or IV material) as used herein includes at least one group IV (carbon group) element (e.g., carbon, silicon, germanium, tin, lead), such as Si, Ge, SiGe, or SiC to name some examples. Note that group III-V semiconductor material (or group III-V material or III-V material) as used herein includes at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and indium gallium arsenide (InGaAs), to name some examples. In some embodiments, substrate 200 may include a surface crystalline orientation described by a Miller Index of [100], [110], or [111], or its equivalents, as will be apparent in light of this disclosure. Although substrate 200, in this example embodiment, is shown as having a thickness (dimension in the Y-axis direction) similar to other layers for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2B:
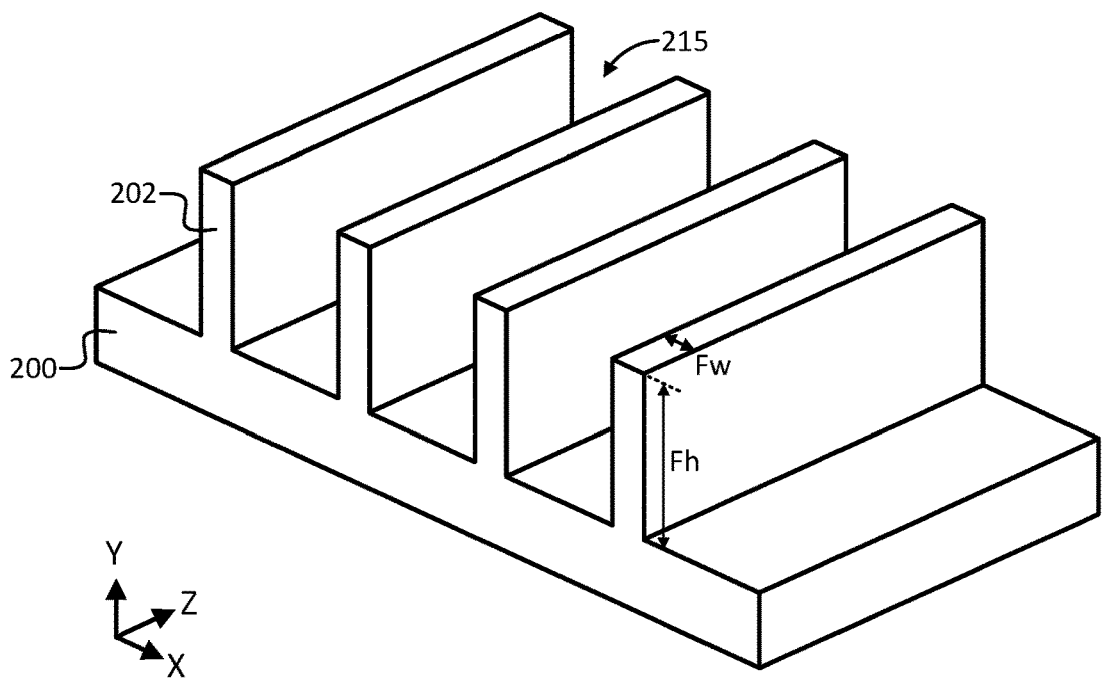

Method 100 of FIG. 1A continues with performing 104 shallow trench recess (STR) etch to form fins 202 from substrate 200, thereby forming the resulting example structure shown in FIG. 2B, in accordance with an embodiment. The STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ, for example. Trenches 215 may be formed with varying widths (dimension in the X-axis direction) and depths (dimension in the Y-axis direction) as can be understood based on this disclosure. For example, multiple hardmask patterning 102 and STR etching 104 processes may be performed to achieve varying depths in the trenches 215 between fins 202. Fins 202 may be formed to have varying widths Fw (dimension in the X-axis direction) and heights Fh (dimension in the Y-axis direction) and pitch. For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects, if such an ART scheme is used.

In some embodiments, the fin widths Fw may be in the range of 5-400 nm, for example, or any other suitable value, as will be apparent in light of this disclosure. In some embodiments, the fin heights Fh may be in the range of 10-800 nm, for example, or any other suitable value, as will be apparent in light of this disclosure. In embodiments employing an aspect ratio trapping (ART) scheme, the fins may be formed to have particular height to width ratios such that when they are later recessed and/or removed, the resulting fin trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio of the fins (Fh:Fw) may be greater than 1, such as greater than 1.5, 2, 2.5, 3, 3.5, 4, 4.5, 5, 6, 7, 8, 9, or 10, or any other suitable threshold ratio, as will be apparent in light of this disclosure. Note that the trenches 215 and fins 202 are each shown as having the same widths and depths/heights in this example structure for ease of illustration; however, the present disclosure is not intended to be so limited. For example, in some embodiments, the fins 202 may be formed to have varying heights Fh and/or varying widths Fw. Further note that although four fins 202 are shown in the example structure of FIG. 2B, any number of fins may be formed, such as one, two, ten, hundreds, thousands, millions, and so forth, as can be understood based on this disclosure.

In still other embodiments, the fins can be formed using an aspect ratio trapping (ART) methodology, such as that described in U.S. Patent Application Publication 2014/0027860. In more detail, the substrate can be patterned and etched into placeholder fins formed from the substrate material, as described above. Those fins are then encased in an insulator or other suitable material. The place holder fins can then selectively be recessed or otherwise removed and replaced with a desired semiconductor material(s). In some such cases, the replacement channel material can be provided in the context of multilayer stacks that include alternating layers of desired channel material and sacrificial/inactive material, such as that described in U.S. Patent Application Publication 2016/0260802. In any such cases, the various replacement fin materials may have one or more graded components. As will be appreciated, grading can be used to facilitate a desired lattice matching scheme in the context of lattice-diverse materials, as will be appreciated.

Thus, the fins may be, for example, native substrate material, or an alternate (not substrate) material, or a material stack, or some combination of these things. Note that the fins in reality may not be perfectly square as shown. Rather, the fins may have a tapered shape, such that each fin gets progressively thinner as the height of the fin increases. The fin widths can vary, depending on the process node, but in some embodiments are in the range of 3 nm to 30 nm wide, as measured at the widest part of the active channel portion of the fin. Grading of a component may be used as noted. For instance, a concentration of germanium can be graded from a low level compatible with a silicon substrate to some higher level (e.g., in excess of 50 atomic percent germanium).

Method 100 of FIG. 1A continues with depositing 106 shallow trench isolation (STI) layer 220 and planarizing to form the resulting example structure shown in FIG. 2C, in accordance with an embodiment. In some embodiments, deposition 106 of STI layer 220 may include any deposition process described herein (e.g., CVD, ALD, PVD), or any other suitable deposition process. The material of STI layer 220 may include any suitable insulating material, such as one or more dielectric, oxide (e.g., silicon dioxide), or nitride (e.g., silicon nitride) materials. In some embodiments, the material of STI layer 220 may selected based on the material of substrate 200. For instance, in the case of a Si substrate, STI material may be silicon dioxide or silicon nitride, to provide an example.

Method 100 of FIG. 1A continues with recessing 108 the STI material 220 to cause at least a portion 204 of fins 202 to exude from the STI plane, thereby forming the resulting example structure shown in FIG. 2D, in accordance with an embodiment. As shown in FIG. 2D, the portion 204 of fin 202 exuding above the top plane of STI layer 220 (indicated as 204) has an active fin height indicated as Fah, which may be in the range of 10-750 nm, for example, or any other suitable value, as will be apparent in light of this disclosure. As is also shown, the portion 203 of fin 202 that is below the top plane of STI layer 220 is the sub-fin portion (indicated as 203). Note that in this example embodiment, fins 202 (including portions 203 and 204) are native to substrate 200. In other words, fins 202 were formed from substrate 200 in this example embodiment and include the same material in the structure of FIG. 2D, such that fins 202 (including portions 203 and 204) and substrate 200 are one homogenous structure. However, in other embodiments, some or all of fins 202 may be removed and replaced with replacement fins using an ART-based process as previously noted, for example. In some such embodiments, the processing may continue from the structure of FIG. 2C and include etching the fins 202 (e.g., using any suitable wet and/or dry etch processes) to form fin trenches between STI layer 220, where the etching either completely or partially removes fins 202 (e.g., either goes all the way to/past the bottom plane of STI layer 220 or does not, respectively). In such an embodiment, the fin trenches can be used for the deposition of a replacement material, and continuing with recess process 108 would result in the fins of FIG. 2D being replacement fins (which may include different material than what is included in substrate 200). In some such embodiments, the replacement material may include group IV semiconductor material and/or group III-V semiconductor material, and/or any other suitable material as will be apparent in light of this disclosure. For instance, replacement fins including SiGe may be formed by removing native Si fins during such processing and replacing them with the SiGe material, to provide an example. Note that in some such embodiments where the fins are removed and replaced (and thus, are not native fins), an ART processing scheme may be employed, where the fin trenches have a high aspect ratio (e.g., height:width ratio of greater than 1, 1.5, 2, 3, 4, 5, or a higher value). Such an ART processing scheme may be employed, for example to trap dislocations, thereby preventing the dislocations from reaching the epitaxial film surface and greatly reducing the surface dislocation density within the trenches.

Regardless of whether active fin portions 204 are native to substrate 200 or not, method 100 of FIG. 1A may optionally continue with forming 110 vertical isolation structures 230 as shown in FIG. 2E, in accordance with an embodiment. As can be understood based on this disclosure, FIG. 2F illustrates the example structure of FIG. 2D, including vertical isolation structures 230. Therefore, the previous relevant description with respect to the example structure of FIG. 2D is equally applicable to the example structure of FIG. 2F. In some embodiments, vertical isolation structures 230 may be formed to, for example, further isolate (or electrically insulate) single fins or groups of fins. For instance, in the example structure of FIG. 2F, such vertical isolation structures are present and may be included to prevent the eventual S/D regions of one transistor device from shorting the S/D of another (e.g., adjacent) transistor device by ensuring the respective S/D regions stay separate. Accordingly, such vertical isolation structures 230 may be formed using any suitable techniques and, when present the structures 230 may include any suitable electrical insulator material, such as a dielectric, oxide, nitride, and/or carbide material, for instance. Note that although the vertical isolation structures 230 are higher (dimension in the Y-axis direction) than fins 204, the present disclosure is not intended to be so limited. Also, because vertical isolation structure 230 need not be present in some disclosure, as they are optional, method 100 will continue to be described using IC structures without the vertical isolation structures 230, for ease of description.

Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. In such an example case, process 112—forming a dummy gate stack—would not be performed, and thus, process 112 is optional in some embodiments (such as those employing the gate first process flow). This is reflected on the right side of the process flow of FIG. 1A, where performing 116 the final gate stack processing 116 may be performed prior to performing 114 the S/D processing, for example. However, the description of method 100 will continue using a gate last process flow, to allow for such a flow (which may include additional processes) to be adequately described.

Method 100 of FIG. 1A continues with forming 112 a dummy gate stack, including dummy gate dielectric 242 and dummy gate electrode 244, thereby forming the example resulting structure of FIG. 2F, in accordance with an embodiment. As described above, process 112 is optional, because it need not be performed in all embodiments (such as those employing a so-called gate first process flow, rather than a gate last or so-called RMG process). In this example embodiment, which uses an RMG process, dummy gate dielectric 242 (e.g., dummy oxide material) and dummy gate or dummy gate electrode 244 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and can help with replacement gate processes, for example. As can be understood based on this disclosure, the dummy gate stack (and spacers 250) help define the channel region and source/drain (S/D) regions of each fin, where the channel region is below the dummy gate stack (as it will be located below the final gate stack), and the S/D regions are on either side of the dummy gate stack. Note that because the IC structures are being described in the context of forming finned transistors, the final gate stack will also be adjacent to either side of the fin, as the gate stack will reside along three walls of the finned channel regions, in some embodiments. Formation of the dummy gate stack may include depositing the dummy gate dielectric material 242 and dummy gate electrode material 244, patterning the dummy gate stack, depositing gate spacer material 250, and performing a spacer etch to form the structure shown in FIG. 2F, for example. Spacers (STI) 250 may include any suitable material, such as any suitable electrical insulator, dielectric, oxide (e.g., silicon oxide), and/or nitride (e.g., silicon nitride) material, as will be apparent in light of this disclosure. Note that in some embodiments, the techniques described herein need not include forming a dummy gate stack, such that a final gate stack may be formed in the first instance. Regardless, the end structure will include the end gate stack, as will be apparent in light of this disclosure. Also note that in some embodiments, a hardmask (not shown) may be formed over the dummy gate stack (which may also be formed over spacers 250) to protect the dummy gate stack during subsequent processing, for example.

Figure 2G:
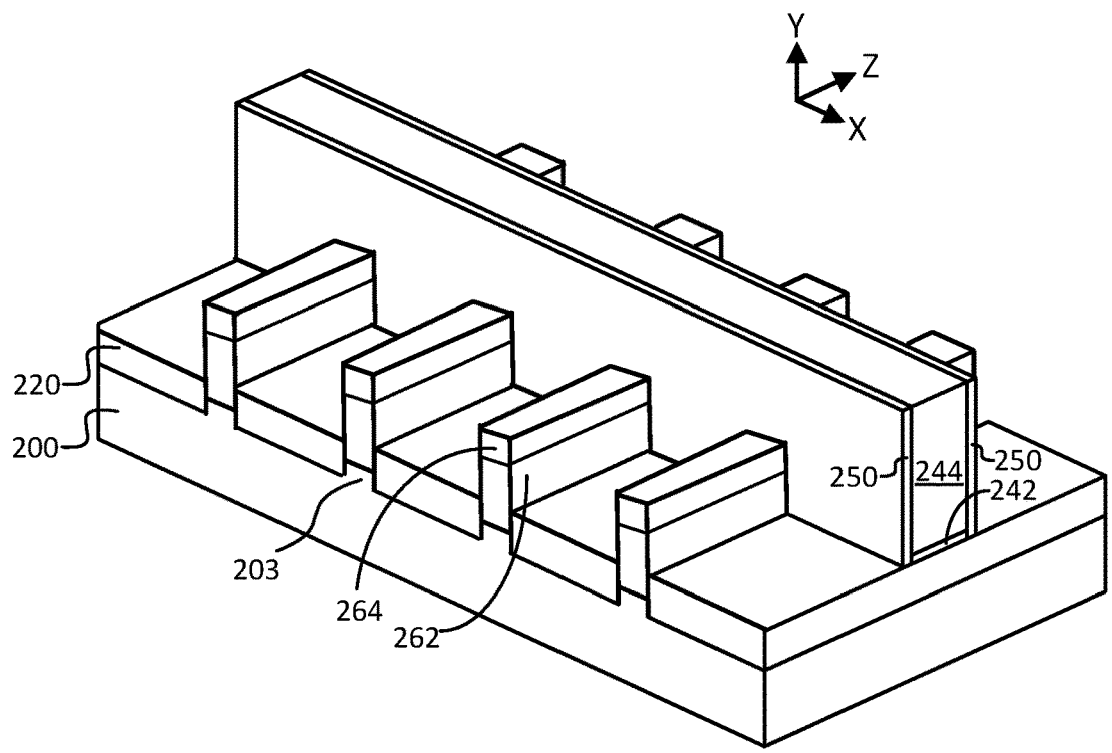

Method 100 of FIG. 1A continues with performing 114 source/drain (S/D) processing to form the example resulting structure of FIG. 2G, in accordance with an embodiment. As shown in FIG. 2G, the structure includes S/D regions 262 that can be comprised of a group IV semiconductor element such as, for example, germanium. In some embodiments, the S/D regions can be in physical contact with substrate 200 via sub-fin portion 203 although sub-fin portion 203 may also be non-integral to substrate 200. The S/D regions, in some embodiments, may be formed using any suitable techniques, such as masking regions outside of the S/D regions to be processed, etching portions of the fins from the structure of FIG. 2G (in this example case, active portions 204 were etched and removed, leaving only sub-fin portions 203, as shown in FIG. 2G), and forming/depositing/growing the S/D regions (e.g., using any suitable techniques, such as CVD, ALD, PVD), to produce S/D portion 262. In some embodiments S/D portion 262 can be epitaxially grown on sub-fin portion 262. In some embodiments, the native fin 204 material (i.e., native to substrate 200) may remain in the S/D regions, where such native material is doped to form the final S/D regions. In some such embodiments, the S/D regions may or may not include an additional contact 264. Contact 264 can be conductive and may include one or more elements in common with S/D 262. The material of S/D portion 262 may be native or replacement material, such that there may or may not be a distinct interface between the sub-fin portions 203 and S/D portions 262. In this example embodiment, as the material of S/D portion 262 is replacement material, there is a distinct interface between features 262 and 203, as shown in FIG. 2G. Note that in some instances, where S/D portion 262 includes native material, there may still be a distinct interface between S/D portion 262 and the sub-fin 203, because of the impurity dopants introduced into S/D portion, for example. In some embodiments, S/D portion 262 may have a multi-layer structure including multiple material layers, for example. In some embodiments, S/D portion 262 may include gradations (e.g., increasing and/or decreasing) of the content/concentration of one or more materials in some or all of the portion(s). Note that contact 264 can also be formed later, as described below, after ILD layer 270 has been deposited.

In some embodiments, the S/D regions may be formed one polarity at a time, such as performing processing for one of n-type and p-type S/D regions, and then performing processing for the other of the n-type and p-type S/D regions. In some embodiments, the S/D regions may include any suitable material, such as group IV material (e.g., Si, SiGe, Ge), and may include any suitable doping scheme, as will be apparent in light of this disclosure. In embodiments, where corresponding S/D regions on either side of the channel region (e.g., on either side of the gate stack) are to be used for a MOSFET device, the S/D regions may include the same type of dopants in a source-channel-drain doping scheme of either p-n-p (e.g., for p-MOS) or n-p-n (e.g., for n-MOS), where 'n' represents n-type doping and 'p' represents p-type doping, for example. In embodiments where corresponding S/D regions on either side of the channel region (e.g., on either side of the gate stack) are to be used for a TFET device, the S/D regions may include opposite types of dopants in a source-channel-drain scheme of either p-i-n (e.g., for p-TFET) or n-i-p (e.g., for n-TFET), where 'i' represents intrinsic material (e.g., undoped or relatively minimally doped, such as doping concentration of less than 1E16 atoms per cubic cm), for example. In some embodiments, a multitude of transistor types, and thus, S/D schemes may be employed. For instance, in the structure of FIG. 2G, the four sets of S/D regions may include doping configurations that are all the same, some the same, or none the same, as can be understood based on this disclosure (note that in FIG. 2G, only one S/D region set is indicated for ease of illustration, which is the set that is the second from the right).

In some embodiments, the S/D regions may be doped, as previously stated. Such doping intentionally introduces impurities in a semiconductor material to, for example, modulate the electrical properties of the semiconductor material. Therefore, such impurity doping may be used to change the electrical properties of the group IV semiconductor material of the S/D regions, in some embodiments. In some embodiments, the S/D regions may be doped using any suitable techniques, such as via ion implantation and/or depositing the dopants with the primary group IV semiconductor material, and/or any other suitable techniques as will be apparent in light of this disclosure. In embodiments where implantation is used, the implantation of the dopants could be into native and/or replacement S/D material, for example. Further, in embodiments where implantation is used, the impurity dopants may be implanted with or without preamorphizing treatments, for example. Any number of doping processes may be performed as desired to introduce double-charge and/or single-charge dopants in the primary group IV semiconductor material of one or more S/D regions, as will be apparent in light of this disclosure.

S/D regions may be doped in any desired concentration, such as in a concentration in the range of 1E15 to 1E22 atoms per cubic centimeter (cm) (e.g., in the range of 5E19 to 5E21 atoms per cubic cm), or any other suitable concentration as will be apparent in light of this disclosure. In an example embodiment, a very high dopant concentration may be approximately 2E20 atoms per cubic cm (e.g., 2E20 plus/minus 1E20 atoms per cubic cm). Recall that dopants for group IV semiconductor material (e.g., Si, SiGe, Ge) can include phosphorous (P), arsenic (As), antimony (Sb), bismuth (Bi) and lithium (Li) for n-type dopants (donors) and boron (B), aluminum (Al), nitrogen (N), gallium (Ga) and indium (In) for p-type dopants (acceptors); although, other suitable single-charge dopants may be known to those in the art. However, such single-charge dopants need not be present in both S/D portion 262 and the S/D contact 264 for a given S/D region, but may only be present in one of the portions, for example the cap portion. Further, in some embodiments, only double-charge dopants (e.g., S, Se, and/or Te) may be present in a given S/D region. S/D regions may be doped at different concentrations including lowest dopant concentrations (P−), higher dopant concentration (P), even higher dopant concentration (P+), and the highest dopant concentration (P++). S/D portion 262 and S/D cap portion may include the same or different dopant concentrations and in one embodiment the base S/D region can be intrinsic and the cap S/D region can be very highly doped (P). In some embodiments, dopants from one layer will diffuse into an adjacent layer resulting in partial doping of one or more layers.

In some embodiments, the level of doping in the semiconductor material may be very high (P++). For instance, in some cases, group IV semiconductor material (e.g., Ge) may be considered P++(or N++) doped when impurity dopants are present at a concentration of greater than 1E18, 1E19, 1E20, 5E20, 1E21, or 5E21 atoms per cubic cm, or some other suitable threshold doping level as will be apparent in light of this disclosure. In some embodiments, P++ doping of the S/D region may be desired to reduce contact resistance with the S/D contacts and thereby improve/enhance performance of the transistor. In a more general sense, any S/D doping schemes can be used here, and the present disclosure is not intended to be limited to any particular one.

Figure 2H:
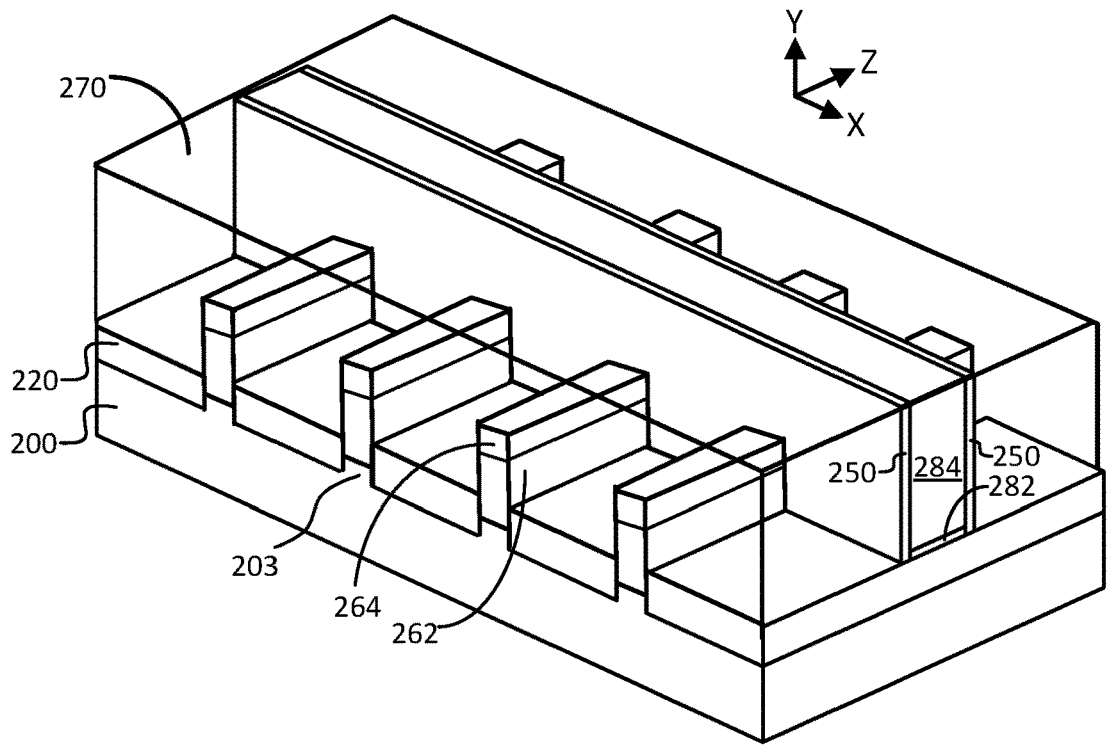

Method 100 of FIG. 1A continues with performing 116 gate stack processing to form the example resulting structure of FIG. 2H. As shown in FIG. 2H, the processing in this example embodiment included depositing interlayer dielectric (ILD) layer 270 on the structure of FIG. 2F, followed by optional planarization and/or polishing to reveal the dummy gate stack. Note that ILD layer 270 is not shown in the example structure of FIG. 2H to allow for the underlying features to be seen; however, the present disclosure is not intended to be so limited. The gate stack processing, in this example embodiment, continued with removing the dummy gate stack (including dummy gate 244 and dummy gate dielectric 242) to allow for the final gate stack to be formed. Recall that in some embodiments, the formation of the final gate stack, which includes gate dielectric layer 282 and gate (or gate electrode) 284, may be performed using a gate first flow (also called up-front hi-k gate). In such embodiments, the gate processing may have been performed after process 108 or after optional process 110 (in embodiments where process 110 is performed) and prior to the S/D processing 114. However, in this example embodiment, the gate stack is formed using a gate last flow (also called a replacement gate or replacement metal gate (RMG) process). In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric layer 282 and gate 284 as shown in FIG. 2H.

Note that when the dummy gate is removed, the channel region of fins 204 (that were covered by the dummy gate) are exposed to allow for any desired processing of the channel regions of the fins. Such processing of the channel region may include various different techniques, such as removing and replacing the channel region with replacement material, doping the channel region of the fin as desired, forming the fin into one or more nanowires (or nanoribbons) for a gate-all-around (GAA) transistor configuration, cleaning/polishing the channel region, and/or any other suitable processing as will be apparent in light of this disclosure As can be understood based on this disclosure, the channel region is at least below the gate stack. For instance, in the case of a finned transistor configuration, the channel region may be below and between the gate stack, as the stack is formed on three sides as is known in the art. Further, in the case of a nanowire (or nanoribbon or GAA) transistor configuration, the gate stack may substantially (or completely) surround each nanowire/nanoribbon in the channel region. Further still, in the case of a planar transistor configuration, the gate stack may simply be above the channel region. In some embodiments, the channel region includes group IV semiconductor material, such as Si, Ge, SiGe, SiGe:C, and/or GeSn, to provide some examples. In some embodiments, the channel region may be doped (e.g., with any suitable n-type and/or p-type dopants) or undoped, depending on the particular configuration. Note that the S/D regions are adjacent to either side of the channel region, as can be seen in FIG. 2H, for example. Also note that the configuration/geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor. However, transistor type (e.g., MOSFET or TFET or other suitable type) may be described based on the doping and/or operating scheme of the source, drain, and channel, and thus those respective regions may be used to determine the type or classification of a given transistor, for example. This is especially true for MOSFET versus TFET transistors, as they may structurally be similar (or the same), but include different doping schemes (e.g., p-n-p or n-p-n versus p-i-n or n-i-p, respectively).

Continuing with performing 116 gate stack processing, after the dummy gate has been removed and any desired channel region processing has been performed, the final gate stack can be formed, in accordance with an embodiment. In this example embodiment, the final gate stack includes gate dielectric layer 282 and gate 284, as shown in FIG. 2H. The gate dielectric layer 282 may include, for example, any suitable oxide (such as silicon dioxide), high-k gate dielectric material, and/or any other suitable material as will be apparent in light of this disclosure. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, aluminum nitride, silicon oxynitride, aluminum oxynitride and lead zinc niobate, to provide some examples. In some embodiments, an annealing process may be carried out on the gate dielectric layer 282 to improve its quality when high-k material is used. The gate 284 (or gate electrode) may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate dielectric layer 282 and/or gate 284 may include a multilayer structure of two or more material layers, for example. In some embodiments, gate dielectric layer 282 and/or gate 284 may include grading (e.g., increasing and/or decreasing) the content/concentration of one or more materials in at least a portion of the feature(s). Additional layers may be present in the final gate stack, in some embodiments, such as one or more work function layers or other suitable layers, for example. Note that although gate dielectric layer 282 is only shown below gate 284 in the example embodiment of FIG. 2H, in other embodiments, the gate dielectric layer 282 may also be present on one or both sides of gate 284, such that the gate dielectric layer 282 is between gate 284 and spacers 250, for example.

Figure 3A:
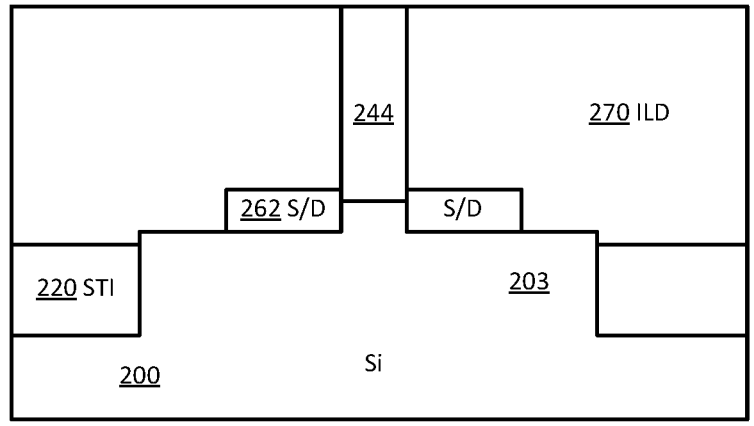
FIGS. 3A to 3G provide cross-sectional views of structures formed in carrying out the method of FIG. 1B, in accordance with an embodiment of the present disclosure.

Method 100 of FIG. 1A continues with process 118 of forming the local interconnect to the source/drain regions. Process 118 is broken down in FIG. 1B. FIGS. 3A-3G provide the detailed process flow of one embodiment of a method for making a low resistance local interconnect (LI) system for a semiconductor integrated circuit. FIG. 3A provides a cross-sectional view of the device of FIG. 2H, looking along the x-axis at a y-z plane slice through a pair of S/D regions. FIG. 3A shows interlayer dielectric (ILD) layer 270, S/D regions 262, substrate 203 and STI 220. In some embodiments, ILD layer 270 may include any suitable electrical insulator, dielectric, oxide (e.g., silicon oxide), and/or nitride (e.g., silicon nitride) material, as will be apparent in light of this disclosure. In various embodiments, the local interconnect and a source/drain contact can be formed independently of each other or at the same time using a single procedure. The composition of the source/drain region can be altered by one or more of these procedures. In some embodiments, the formation of one or more of the LI, the S/D region, and the S/D contact can be done after the deposition of ILD layer 270. The demarcation between a source/drain contact and the local interconnect in some embodiments may be obscured or eliminated as the contact and local interconnect may be of identical or similar compositions, and the contact and local interconnect can be formed in a single procedure.

Figure 3B:
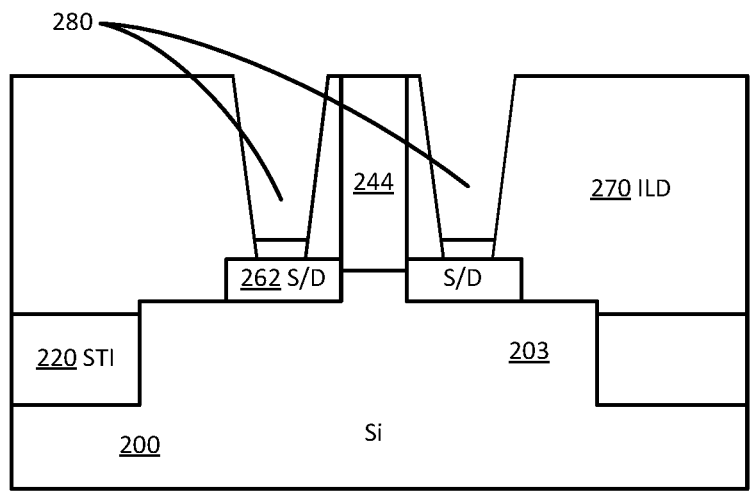

Forming trench 302 is shown in FIG. 3B, where trench (or via) 280 has been etched through ILD layer 270 to provide an opening connecting the upper planar surface of ILD layer 270 to S/D region 262. In the embodiment shown, trench 280 is conical but in other embodiments may be of different shapes such as, for example, cylindrical or elliptical. In some embodiments, the walls of the trench are not parallel and opposing sides of a trench wall can be, for example, greater than 2°, greater than 5°, or greater than 10° out of alignment. Trench 280 can have an aspect ratio, height to width at narrowest diameter, of greater than 2:1, greater than 5:1 or greater than 10:1, for example. Trench 280 can be formed using etching processes such as dry and wet etching processes that may be chosen based on the composition of the ILD layer and the composition of the S/D region. Trench 280 can be any length that is appropriate to extend through the y thickness of ILD layer 270. The axis of trench 280 can be normal to a surface of the ILD layer or may be angled in relation to a surface of the ILD layer. In some embodiments the trench can be 50 to 300 nanometers long. In some embodiments, trench 280 can have regions that have a diameter of less than 50, less than 25, less than 14 or less than 10 nm. At these diameters it can be difficult to uniformly deposit a metal LI so that it can form a low resistance interface with contact 264 and S/D region 262. This may be rendered even more difficult by the space restrictions caused by the inclusion of a barrier or liner, or both, in trench 280. It has been found, however, that group IV materials such as germanium can be deposited in trench 280 uniformly and in electrical contact with contact 264 or with S/D region 262, and can be functional without including a barrier or liner or both.

Figure 3C:
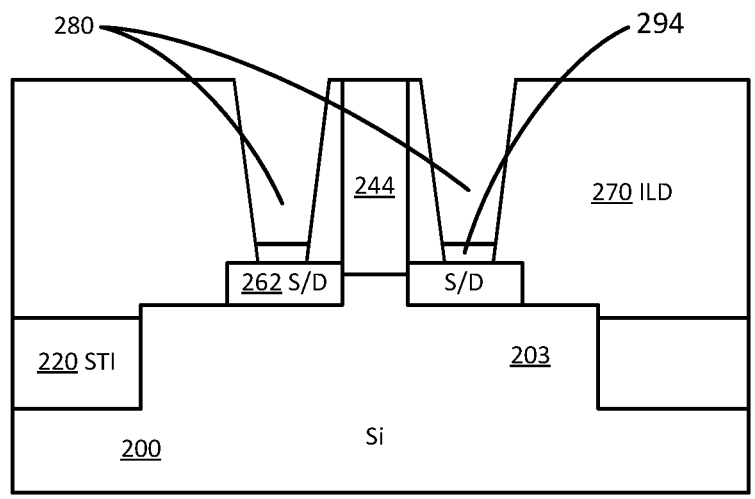
Figure 3D:
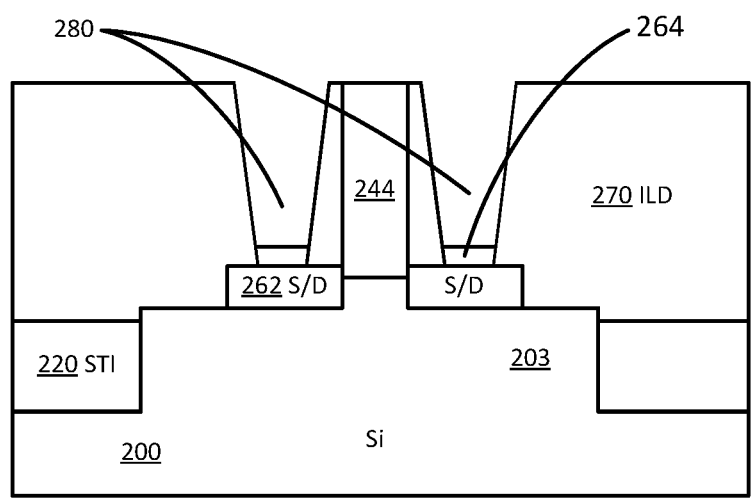

FIG. 3C illustrates a portion of an embodiment of process 118 in which a layer of alloying material 282, such as nickel, is deposited 304 at the base of trench 280 on the surface of S/D region 262. In some embodiments, S/D region 262 can include at least one of Si, Ge or SiGe. Alloying materials instead of or in addition to Ni can be used and can be chosen, for example, based on their ability produce an alloy layer of decreased interfacial resistance and improved conductivity. Deposition of the alloying material can be done by methods described elsewhere herein, such as CVD, PVD or ALD and in some embodiments is a bottom-up process wherein deposition begins at the lowest portions of trench 280 and proceeds upward toward the surface of ILD 270. After a desired quantity of alloying material has been deposited, for example in some embodiments, 1A-5 nm, 5-10 nm, 10-50 nm or 10-100 nm, the material can be annealed 306 in contact with S/D material 262. Although the process can vary, in the illustrated embodiment, S/D material 262 provides a source of group IV atoms, Ge for example, that migrate into alloying layer 294. After an appropriate time and temperature, layer 294 becomes alloy contact 264 comprising, for example, NiGe. This result is illustrated in FIG. 3D, that shows contact 264 on the surface of S/D layer 262. The interface between layers 264 and 262 may not be as defined as shown in FIG. 3D and may show a continuous gradation of Ni content that decreases from the top down starting at the upper surface of contact 264 and progressing to the top surface of S/D region 262. In some cases, Group IV atoms or nickel atoms, or both, may migrate between layer 294 and S/D region 262 so that layer 294 and S/D region become very similar or indistinguishable or homogeneous. In some embodiments, the ratio of Group IV material to Ni in contact 264 compared to the same ratio in S/D region 262 may be the same, within 10%, within 20% or within 50% on an atomic basis. In some cases, pure metal will remain after completion of the annealing process. In these instances, any metal that remains, in this case nickel, can be etched out using wet or dry etching processes to assure that the contact is pure alloy without any metal incursions or coatings on the surface of contact 264. Note that the order of operations can be changed in various embodiments and that in some cases contact 264 can be formed prior to the deposition of ILD layer 270.

Figure 3E:
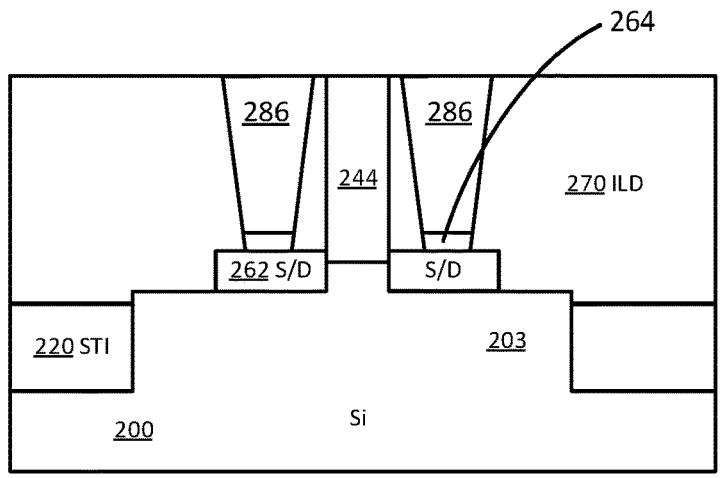

As illustrated in the embodiment of FIG. 3E, after the formation of contact 264, process 118 continues by filling or partially filling trench 280 (FIG. 3D) by depositing 308 a layer 286 of material that can either be conductive or altered later to render it conductive. The material can be, for example, a Group IV material such as Ge, Si or SiGe. Filling techniques include PVD, CVD and ALD, for example, and can be a bottom-up process where deposition starts at the lowest portions of trench 280 and proceeds upwardly to the surface of ILD 270. In the embodiment shown, trench 280 is filled with a group IV element such as germanium to produce a feature that can have a length of, for example, 50-300 nm and a width, at its narrowest point, of less than 25, less than 14, less than 10 or less than 7 nm. In some embodiments, fill layer 286 is selected to match the composition of S/D region 262 or contact 264. In other embodiments, the composition of fill layer 286 is a material that can be subsequently altered to match the composition of S/D region 262 or contact 264. In some embodiments, fill layer 286 for example, can be germanium that can later be converted to NiGe or NiSiGe. In other embodiments, trench 280 can be filled directly with two components that form the alloy upon deposition, such as NiGe, that does not need additional chemical treatment to mimic the composition of contact 264 or S/D region 262. In the embodiment illustrated in FIG. 3F, trench 280 has been filled with elemental Group IV material layer 286. A layer of alloying material 288, in this case Ni, has been deposited across the surface of layer 286 and the structure is annealed 310 to form, for example, NiGe. The alloying layer may optionally include a migration suppression agent such as Pt or Pd. The thickness of alloying layer 288 can be chosen, at least in part, based on the composition, depth and volume of fill layer 286. For instance, in some embodiments, the thickness of alloying layer 288 is chosen so that a subsequent annealing process drives nickel sufficiently into layer 286 so that the concentration of alloying element in the portion of fill layer 286 that is proximal to contact 264 contains more than 20%, more than 50% or more than 75% of the concentration of nickel (or other alloying material) contained in contact 264. In various embodiments, the concentration of nickel (or other alloying material) in fill layer 286 may be greater than, equal to or less than the concentration in contact 264 or S/D region 262.

In another set of embodiments, trench 280 of FIG. 3B can be filled with a Group IV material such as Ge, Si or SiGe. In this case, there need not be an independent contact 264 as illustrated in FIG. 3E. The Group IV material can be deposited starting on the S/D region 262 and can continue to fill trench 280 upwardly either partially or completely to the surface (or above) of ILD 270. Fill layer 286 may then include a Group IV material and may, in some embodiments, be exclusively a Group IV material. In a manner analogous to that described above, a nickel layer can be deposited over the top of fill layer 286 and the two materials can be annealed together. The nickel layer may include a migration suppression agent. Annealing may drive nickel to or into S/D region 262. In some cases, the nickel content of S/D region 262 may be more than 20%, more than 50% or more than 75% of the average nickel concentration in fill layer 286. In particular embodiments, S/D region 262 and fill layer 286 may be homogeneous.

Figure 3F:
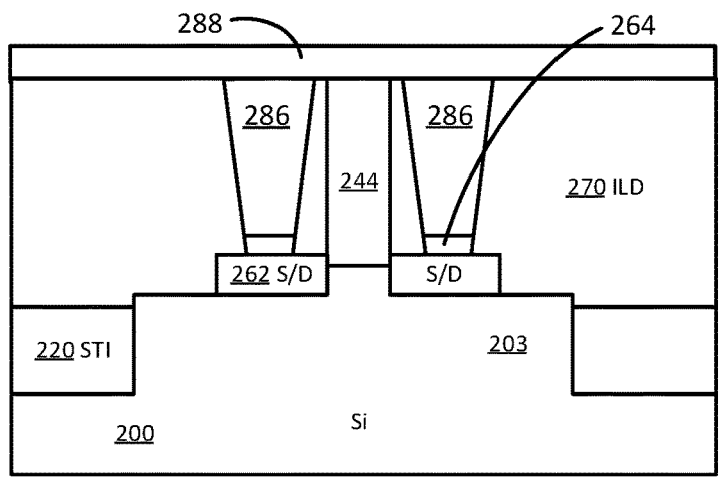
Figure 3G:
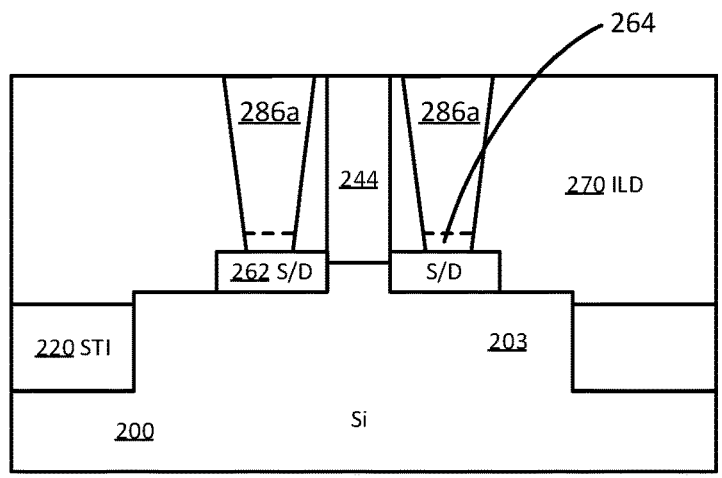

FIG. 3G provides a view of the embodiment of FIG. 3F after fill material 286 has been annealed 310 to include a nickel component. Any remaining residues of nickel layer 288 can be removed 312 by, for example, etching or polishing. Local interconnect layer 286a, which was previously a Group IV material, now comprises Ni and can be a Group IV/Ni alloy after the annealing process. In some embodiments, as shown in FIG. 3G, local interconnect 286a has a composition similar or identical to contact 264 and the components are indistinguishable (as evidenced by a dashed line therebetween). In some embodiments, the composition of local interconnect 286a and contact 264 may be identical, but an interface between the two may still be detectable. In other embodiments, local interconnect 286a and contact 264 are not of identical composition and can be distinguished. In further embodiments, the S/D region, contact 264 and LI 286a may be indistinguishable from each other. In still other embodiments, there may be a gradation of Ni concentration that is greatest at the top of LI 286a and lowest at contact 264 or at S/D region 262. The similar or identical composition of these components can result in less interfacial resistance leading to lower external resistance (Rext) of the semiconductor device.

Method 100 of FIG. 1A continues with completing 120 integrated circuit (IC) processing, as desired, in accordance with some embodiments. Such additional processing to complete the IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-120 of method 100 are shown in a particular order in FIG. 1A for ease of description. However, one or more of the processes 102-120 may be performed in a different order or may not be performed at all. For example, box 110 is an optional process that need not be performed if the etch resistant vertical structures are not desired. Further, box 112 is an optional process that need not be performed in embodiments employing a gate first process flow, for example. Moreover, such a gate first process flow changes when process 116 is performed, as shown using alternative and optional gate first flow 100', whereby the final gate stack processing is performed 116 prior to performing 114 the S/D processing. Numerous variations on method 100 and the techniques described herein will be apparent in light of this disclosure. Recall that the techniques may be used to form one or more transistor devices including any of the following: field-effect transistors (FETs), metal-oxide-semiconductor FETs (MOSFETs), tunnel-FETs (TFETs), planar configurations, finned configurations (e.g., fin-FET, tri-gate, dual-gate), and/or nanowire (or nanoribbon or gate-all-around) configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). Numerous variations and configurations will be apparent in light of the present disclosure.

Example System

Figure 4:
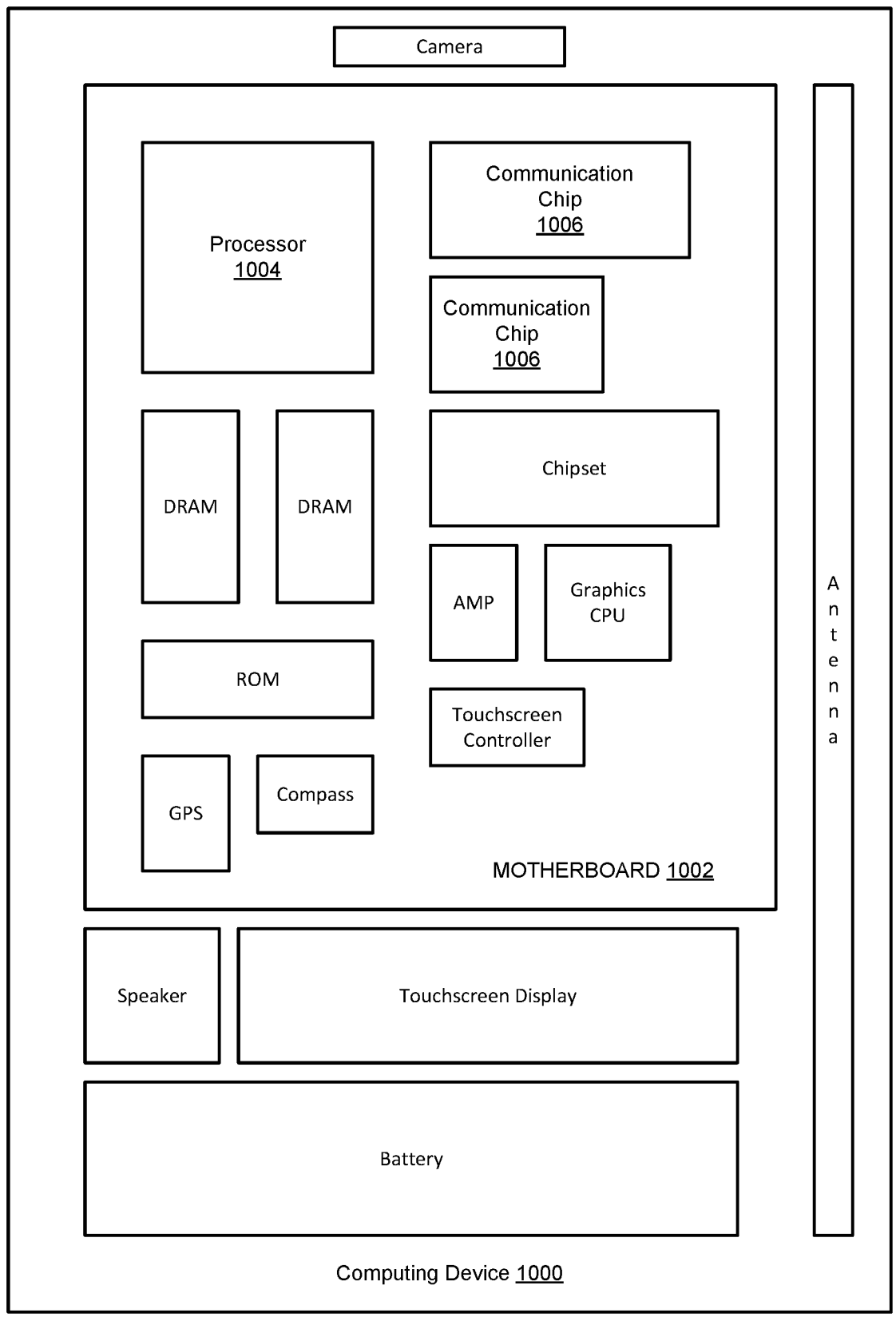
FIG. 4 illustrates a computing system implemented with one or more transistor structures configured in accordance with an embodiment of the present disclosure.

FIG. 4 illustrates a computing system 1000 implemented with one or more transistor structures configured in accordance with an example embodiment of the present disclosure. As can be seen, the computing system 1000 houses a motherboard 1002. The motherboard 1002 may include a number of components, including but not limited to a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more transistor structures as described herein (e.g., having a low resistance Ni-based local interconnect). These transistor structures can be used, for instance, to implement an on-board processor cache or memory array. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present disclosure, the integrated circuit die of the processor includes onboard memory circuitry that is implemented with one or more transistor structures as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip includes one or more devices implemented with one or more transistor structures as described herein (e.g., on-chip processor or memory). As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs low contact resistance transistor devices as described herein (e.g., CMOS devices having both p and n type devices).

Further Example Embodiments

The following examples pertain to further embodiments, from which numerous permutations and configurations will be apparent.

Example 1 is a semiconductor integrated circuit that includes a transistor channel, a source/drain region adjacent the transistor channel, an interlayer dielectric over the source/drain region, and a local interconnect in the interlayer dielectric and in direct contact with the source/drain region, the local interconnect including a metal and a Group IV material and the source/drain region including the Group IV material.

Example 2 is the integrated circuit of Example 1 wherein the Group IV material is one of silicon (Si), germanium (Ge), or silicon germanium (SiGe).

Example 3 is the integrated circuit of any one of Examples 1 or 2 wherein the local interconnect includes a contact on the source/drain region.

Example 4 is the integrated circuit of any of Examples 1, 2 or 3 wherein the local interconnect extends from a first surface of the interlayer dielectric to an opposed second surface of the interlayer dielectric.

Example 5 is the integrated circuit of any one of the preceding examples wherein the local interconnect includes Si.

Example 6 is the integrated circuit of any one of the preceding examples wherein the local interconnect includes at least one of platinum (Pt), palladium (Pd), and darmstadtium (Ds).

Example 7 is the integrated circuit of any one of the preceding examples wherein the local interconnect includes an alloy.

Example 8 is the integrated circuit of any one of the preceding examples wherein the source/drain region are at least one of in or on a substrate and the source/drain region includes at least one component that is graded from a first concentration compatible with the substrate to a second concentration that is compatible with the local interconnect.

Example 9 is the integrated circuit of any one of the preceding examples wherein the source/drain region comprising the Group IV material also includes a metal.

Example 10 is the integrated circuit of any one of the preceding examples wherein a metal concentration at a proximal end of the local interconnect is within +/−50% of the metal concentration at a distal end of the local interconnect.

Example 11 is the integrated circuit of any one of the preceding examples wherein the metal comprises Ni, Co or W.

Example 12 is the integrated circuit of any one of the preceding examples wherein the integrated circuit includes a non-planar transistor architecture selected from at least one of a FinFET transistor and a nanowire transistor.

Example 13 is the integrated circuit of any one of the preceding examples wherein at least a portion of the group IV material of the source/drain region is doped at greater than 1E18 atoms/cm$^3$.

Example 14 is the integrated circuit of any one of the preceding examples wherein at least a portion of the group IV material of the source/drain region is doped at greater than 1E19 atoms/cm$^3$.

Example 15 is the integrated circuit of any one of the preceding examples wherein a first portion of the source/drain region is doped and second portion of the source/drain region is undoped.

Example 16 is the integrated circuit of any one of the preceding examples wherein the source/drain region is a raised source/drain region.

Example 17 is the integrated circuit of any one of the preceding examples wherein the interface between the local interconnect and the interlayer dielectric is void of a barrier and a liner.

Example 18 is the integrated circuit of any one of the preceding examples wherein the source/drain region includes epitaxially grown group IV material.

Example 19 is the integrated circuit of any one of the preceding examples wherein the source/drain region includes polycrystalline group IV material.

Example 20 is the integrated circuit of any one of the preceding examples wherein the source/drain region includes amorphous group IV material.

Example 21 is the integrated circuit of any one of the preceding examples wherein the local interconnect has an aspect ratio of greater than 5:1.

Example 22 is an electronic device of any of the preceding examples wherein the local interconnect defines a substantially conical feature in the interlayer dielectric.

Example 23 is the electronic device of Example 22 wherein the local interconnect comprises nickel (Ni) and is void of tungsten (W) and cobalt (Co).

Example 24 is an electronic device comprising a printed circuit board having one or more integrated circuits as defined in any one of the preceding examples.

Example 25 is the electronic device of Example 24 wherein the one or more integrated circuits includes at least one of a communication chip and a processor.

Example 26 is the electronic device of Example 24 or 25 wherein the device is a mobile computing device.

Example 27 is a method of forming a local interconnect, the method comprising depositing a group IV material on a source/drain region to form electrical contact with the source/drain region, the source/drain region comprising at least one of silicon (Si), germanium (Ge), and silicon germanium (SiGe), and alloying the group IV material in situ with a metal to form the local interconnect.

Example 28 is the method of Example 27 wherein depositing the group IV material includes a bottom-up deposition process such that the group IV material grows from the source/drain region toward a top of the interlayer dielectric.

Example 29 is method of Example 27 wherein the deposited group IV material interfaces with a contact on the source/drain region.

Example 30 is the method of any one of Examples 27-29 comprising annealing the group IV material in contact with the metal to form at least one of a silicide and a germanide.

Example 31 is the method of any one of Examples 27-30 wherein the local interconnect has an aspect ratio of greater than 5:1.

Example 32 is the method of any one of Examples 27-31 wherein the width of the local interconnect at its narrowest point is less than 50 nm.

Example 33 is the method of any one of Examples 27-32 wherein the Group IV material is one of Si, Ge, and SiGe.

Example 34 is the method of any one of Examples 27-33 wherein the local interconnect is an alloy comprising nickel and germanium.

Example 35 is the method of any one of Examples 27-34 wherein the local interconnect includes at least one of Si, palladium (Pd), platinum (Pt) and darmstadtium (Ds).

Example 36 is the method of any one of Examples 27-35 wherein the source/drain includes the Group IV material.

Example 37 is the method of any one of Examples 27-36 including etching a trench in the interlayer dielectric.

Example 38 is the method of any one of Examples 27-29 wherein the local interconnect is formed in a trench that is substantially conical.

Example 39 is the method of any one of Examples 27-38 wherein annealing is carried out until a portion of the group IV material that is proximal to the contact contains substantially the same concentration of Ni as does the contact.

Example 40 is the method of any one of Examples 27-39 wherein annealing migrates metal into the source/drain region.

Example 41 is the method of any of Examples 27-40 wherein the local interconnect passes completely through the interlayer dielectric.

Example 42 is the method of any one of Examples 27-40 wherein the local interconnect is positioned in a trench that includes walls that are not parallel to each other.

Example 43 is the method of any one of Examples 29-41 further comprising forming the contact by depositing a layer of nickel via the trench onto a source/drain region, annealing the layer of nickel with the source/drain material, and forming the contact that includes both nickel and material from the source/drain region.

Example 44 is the method of any one of Examples 27-43 comprising removing any residual metal after any one of the alloying and annealing processes.

Example 45 is the method of any one of Examples 27-44 wherein the group IV material is deposited on the interlayer dielectric walls of a substantially vertical trench.

Example 46 is the method of any one of Examples 27-45 wherein the material from the source/drain region includes germanium.

Example 47 is the method of any one of Examples 27-45 comprising forming a trench in the interlayer dielectric prior to depositing the group IV material into the trench.

The foregoing description of the embodiments of the disclosure has been presented for the purposes of illustration and description. It is not intended to be exhaustive or to limit the present disclosure to the precise form disclosed. Many modifications and variations are possible in light of this disclosure. It is intended that the scope of the disclosure be limited not by this detailed description, but rather by the claims appended hereto.

What is claimed is:

1. A semiconductor integrated circuit, comprising:
   semiconductor material;
   a gate structure over at least a portion of the semiconductor material;
   a source or drain region adjacent the portion of the semiconductor material under the gate structure;
   an insulator material over the source or drain region;
   an interconnect structure that extends over each of the gate structure, the source or drain region, and the insulator material, the interconnect structure including a conductive interconnect feature; and
   a local interconnect structure in the insulator material over the source or drain region and in direct contact with the source or drain region, the local interconnect structure including an alloy of metal and a Group IV semiconductor material, such that the alloy provides a continuous path from the source or drain region to the conductive interconnect feature, wherein the metal within the local interconnect structure is graded from a first concentration near the conductive interconnect feature to a second concentration near the source or drain region, the first concentration different from the second concentration.

2. The semiconductor integrated circuit of claim 1 wherein the Group IV semiconductor material is one of silicon (Si), germanium (Ge), or silicon germanium (SiGe), and the metal includes one or more of nickel (Ni), tungsten (W), and/or cobalt (Co).

3. The semiconductor integrated circuit of claim 1 wherein the local interconnect structure comprises a contact portion on the source/drain region and a local interconnect portion that extends from the contact portion to the conductive interconnect feature of the interconnect structure, such that the local interconnect structure is a continuous mass of the alloy that includes the contact portion and the local interconnect portion, and wherein the interconnect structure includes a plurality of metallization layers each extending over each of the gate structure, the source or drain region, and the insulator material, and the conductive interconnect feature is within a first of the metallization layers, and a second of the metallization layers is over the first metallization layer.

4. The semiconductor integrated circuit of claim 1 wherein the alloy further comprises one or more of platinum (Pt), palladium (Pd), and darmstadtium (Ds).

5. The semiconductor integrated circuit of claim 1 wherein the alloy is an alloy of: one or both of silicon and germanium; one or more of nickel, cobalt, and tungsten; and optionally one or more impurities.

6. The semiconductor integrated circuit of claim 1 wherein source or drain region includes impurity dopant and is distinct from the semiconductor material under the gate structure, and wherein the source or drain region comprises at least one component that is graded from a first concentration to a second concentration that is compatible with the local interconnect structure.

7. The semiconductor integrated circuit of claim 1 wherein the source or drain region comprises a body of Group IV semiconductor material and the alloy of the local interconnect structure is in direct contact with the body.

8. The semiconductor integrated circuit of claim 1 wherein the metal is Nickel (Ni) and the Group IV semiconductor material is germanium.

9. The semiconductor integrated circuit of claim 1 wherein the semiconductor material under the gate structure comprises a fin and the gate structure is on top and side surfaces of the fin, or wherein the semiconductor material under the gate structure comprises one or more nanowires or nanoribbons and the gate structure wraps around the one or more nanowires or nanoribbons.

10. The semiconductor integrated circuit of claim 1 wherein a first portion of the source or drain region is doped and a second portion of the source/drain region is undoped, and wherein at least a section of a top surface of the local interconnect structure is coplanar with at least a section of a top surface of the insulator material.

11. The semiconductor integrated circuit of claim 1 wherein the local interconnect structure is void of a barrier and a liner, such that the alloy is in direct contact with the insulator material.

12. The semiconductor integrated circuit of claim 1 wherein the source or drain region comprises germanium and a P-type dopant, and wherein the local interconnect structure has a height to width aspect ratio of greater than 5:1.

13. The semiconductor integrated circuit of claim 1 wherein the first concentration is greater than the second concentration.

14. An electronic device comprising: a printed circuit board having one or more semiconductor integrated circuits as defined in claim 1.

15. The semiconductor integrated circuit of claim 1 wherein the alloy comprises one or more impurities.

16. An integrated circuit, comprising:
a fin structure comprising silicon (Si);
a gate structure over at least a portion of the fin structure;
a source or drain region adjacent the portion of the fin structure under the gate structure, the source or drain region comprising germanium (Ge);
an insulator material over the source or drain region;
an interconnect structure that extends over each of the gate structure, the source or drain region, and the insulator material, the interconnect structure including a conductive interconnect feature; and
a local interconnect structure in the insulator material and in direct contact with the source or drain region, the local interconnect structure including an alloy including a metal and a Group IV semiconductor material,
wherein the local interconnect structure is a continuous body of the alloy that extends from the source or drain region to the conductive interconnect feature,
wherein the local interconnect structure has a first end near the conductive interconnect feature and a second end near the source or drain region, and
wherein the metal within the local interconnect structure is graded from a first concentration near the first end to a second concentration near the second end, the first concentration greater than the second concentration.

17. The integrated circuit of claim 16 wherein the Group IV semiconductor material includes one or both of silicon (Si) and germanium (Ge), wherein the metal includes one or more of nickel (Ni), tungsten (W), and cobalt (Co).

18. The integrated circuit of claim 16 wherein the alloy further comprises one or more of platinum (Pt), palladium (Pd), and darmstadtium (Ds).

19. An integrated circuit, comprising:
one or more nanowires or nanoribbons comprising silicon;
a gate structure wrapped around the one or more nanowires or nanoribbons;
a source or drain region adjacent the one or more nanowires or nanoribbons, the source or drain region comprising germanium (Ge);
an insulator material over the source or drain region;
an interconnect structure that extends over each of the gate structure, the source or drain region, and the insulator material, the interconnect structure including a conductive interconnect feature; and
a local interconnect structure in the insulator material and in direct contact with the source or drain region, the local interconnect structure including an alloy including (i) a metal and (ii) one or more Group IV semiconductor materials that include germanium (Ge), wherein the local interconnect structure is a continuous body of the alloy that extends from the source or drain region to the conductive interconnect feature, and wherein at least one component of the local interconnect structure has a graded concentration along a length of the local interconnect structure.

20. The integrated circuit of claim 19 wherein the one or more Group IV semiconductor material further includes silicon (Si), and the metal includes one or more of nickel (Ni), tungsten (W), and cobalt (Co), wherein the alloy further comprises one or more of platinum (Pt), palladium (Pd), and darmstadtium (Ds), and wherein the metal within the local interconnect structure is graded from a higher concentration near the conductive interconnect feature to a lower concentration near the source or drain region.

* * * * *